US008525157B2

(12) United States Patent
Jeong et al.

(10) Patent No.: US 8,525,157 B2
(45) Date of Patent: Sep. 3, 2013

(54) ORGANIC LIGHT EMITTING DIODE DISPLAY AND METHOD FOR MANUFACTURING THE SAME

(75) Inventors: Hee-Seong Jeong, Yongin (KR); Sung-Soo Koh, Yongin (KR); Tae-Gon Kim, Yongin (KR); Seung-Yeon Cho, Yongin (KR); Chul-Woo Jeong, Yongin (KR); Jae-Yong Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 171 days.

(21) Appl. No.: 13/029,981

(22) Filed: Feb. 17, 2011

(65) Prior Publication Data

US 2011/0204388 A1    Aug. 25, 2011

(30) Foreign Application Priority Data

Feb. 22, 2010    (KR) .................. 10-2010-0015899

(51) Int. Cl.
*H01L 51/50*    (2006.01)
*H01L 51/56*    (2006.01)

(52) U.S. Cl.
USPC ............... 257/40; 257/E51.018; 257/E51.02; 313/504; 313/512; 438/99

(58) Field of Classification Search
None
See application file for complete search history.

(56) References Cited

U.S. PATENT DOCUMENTS

2008/0157655 A1* 7/2008 Choi et al. ................. 313/504
2008/0218067 A1* 9/2008 Lee et al. ................... 313/504

FOREIGN PATENT DOCUMENTS

| JP | 2008108628 | 5/2008 |
|---|---|---|
| KR | 1020060002313 A | 1/2006 |
| KR | 1020060033134 A | 4/2006 |
| KR | 1020070092079 A | 9/2007 |
| KR | 10-0829753 | 5/2008 |
| KR | 10-0846599 | 7/2008 |
| KR | 10-0828823 | 9/2008 |

* cited by examiner

*Primary Examiner* — Matthew W Such
*Assistant Examiner* — Scott Stowe
(74) *Attorney, Agent, or Firm* — Knobbe Martens Olson & Bear LLP

(57) ABSTRACT

An OLED display and a manufacturing method thereof are disclosed. The OLED display includes: a first substrate, an organic light emitting diode formed over the first substrate, the organic light emitting diode including a reflective surface configured to reflect light incident to the organic light emitting diode, a phase delay capping layer formed over the organic light emitting diode, configured to input linearly polarized light and output circularly polarized light, a second substrate disposed over the phase delay capping layer, and a polarizing plate formed over the second substrate, configured to pass through only linearly polarized light.

19 Claims, 4 Drawing Sheets

201
ORGANIC LIGHT EMITTING DIODE DISPLAY AND METHOD FOR MANUFACTURING THE SAME

CROSS-REFERENCE TO RELATED APPLICATIONS

This application claims priority to and the benefit of Korean Patent Application No. 10-2010-0015899 filed in the Korean Intellectual Property Office on Feb. 22, 2010, the entire contents of which are incorporated herein by reference.

BACKGROUND

1. Field

The disclosure relates to an organic light emitting diode (OLED) display suppressing reflection of external light, and a manufacturing method thereof.

2. Description of the Related Technology

An organic light emitting diode (OLED) display is a self emissive display device that displays images using organic light emitting diodes. Light is emitted by energy that is generated when excitons, generated by coupling of electrons and holes within an organic emission layer, drop from an excited state to a ground state. With the emitted light, the OLED display displays an image.

When the OLED display is used in a bright environment, the external light reflection may deteriorate the OLED display's expression of a black color and contrast, and thus there may be a problem of deteriorated visibility.

The information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

Exemplary embodiments provide an organic light emitting diode (OLED) display having minimized thickness and suppressing reflection of external light, and a manufacturing method thereof.

One aspect is an organic light emitting diode (OLED) display including: a first substrate, an organic light emitting diode formed over the first substrate, the organic light emitting diode including a reflective surface configured to reflect light incident to the organic light emitting diode, a phase delay capping layer formed over the organic light emitting diode, configured to input linearly polarized light and output circularly polarized light, a second substrate disposed over the phase delay capping layer, and a polarizing plate formed over the second substrate, configured to pass through only linearly polarized light.

The phase delay capping layer may have a refractive index in a range between about 1.8 and about 2.7.

The phase delay capping layer may have a double refraction characteristic.

The phase delay capping layer may be a ¼ wavelength plate.

The phase delay capping layer may be formed of a material including at least one of titanium oxide, zirconium oxide, cerium oxide, lead oxide, tin oxide, tantalum oxide, indium oxide, and zinc oxide.

The phase delay capping layer may have a thickness in a range between about 0.9 μm and about 1.3 μm.

The phase delay capping layer may include an oblique deposition layer.

The phase delay capping layer may be formed through a thermal deposition process.

The thermal deposition process may be performed with the substrate main body inclined at an angle of between about 40 degrees to about 50 degrees with respect to a deposition direction.

The phase delay capping layer may include a plurality of cylindrical microelements that are inclined with respect to the deposition direction and extended in the deposition direction.

The polarizing plate may be configured to linearly polarize light beams incident from outside the display to the polarizing plate and selectively pass linearly polarized light beams, which then pass through the second substrate and travel to the phase delay capping layer, where the phase delay capping layer may be configured to circularly polarize the light beams incident thereto while transmitting the light beams therethrough, whereby the circularly polarized light beams travel to the organic light emitting diode and may at least be partially reflected on the reflective surface so as to travel back to the phase delay capping layer, which may be configured to further circularly polarize the reflected light beams while transmitting therethrough, whereby the further circularly polarized light beams may travel to the polarizing plate, where the polarizing plate may be configured to substantially not pass the further circularly polarized light beams therethrough to the outside of the display.

Another aspect is an organic light emitting diode (OLED) display manufacturing method including: preparing a substrate main body, forming an organic light emitting diode over the substrate main body, and forming a phase delay capping layer over the organic light emitting diode through a thermal deposition process with the substrate main body inclined at a predetermined angle.

The predetermined angle may be between about 40 degrees to about 50 degrees.

The phase delay capping layer may include a plurality of cylindrical microelements that are inclined with respect to the deposition direction and extended in the deposition direction.

The phase delay capping layer may have a thickness in a range between about 0.9 μm and about 1.3 μm.

The method may further include sealing an encapsulating member and the substrate main body to each other and attaching a polarizing plate to the encapsulating member.

The phase delay capping layer may be formed with a material having a refractive index within a range of about 1.8 to about 2.7.

The phase delay capping layer may have a double refraction characteristic.

The phase delay capping layer may be formed of a material including at least one of titanium oxide, zirconium oxide, cerium oxide, lead oxide, tin oxide, tantalum oxide, indium oxide, and zinc oxide.

Further, the OLED display can be effectively manufactured.

DETAILED DESCRIPTION OF CERTAIN INVENTIVE EMBODIMENTS

Figure 1:
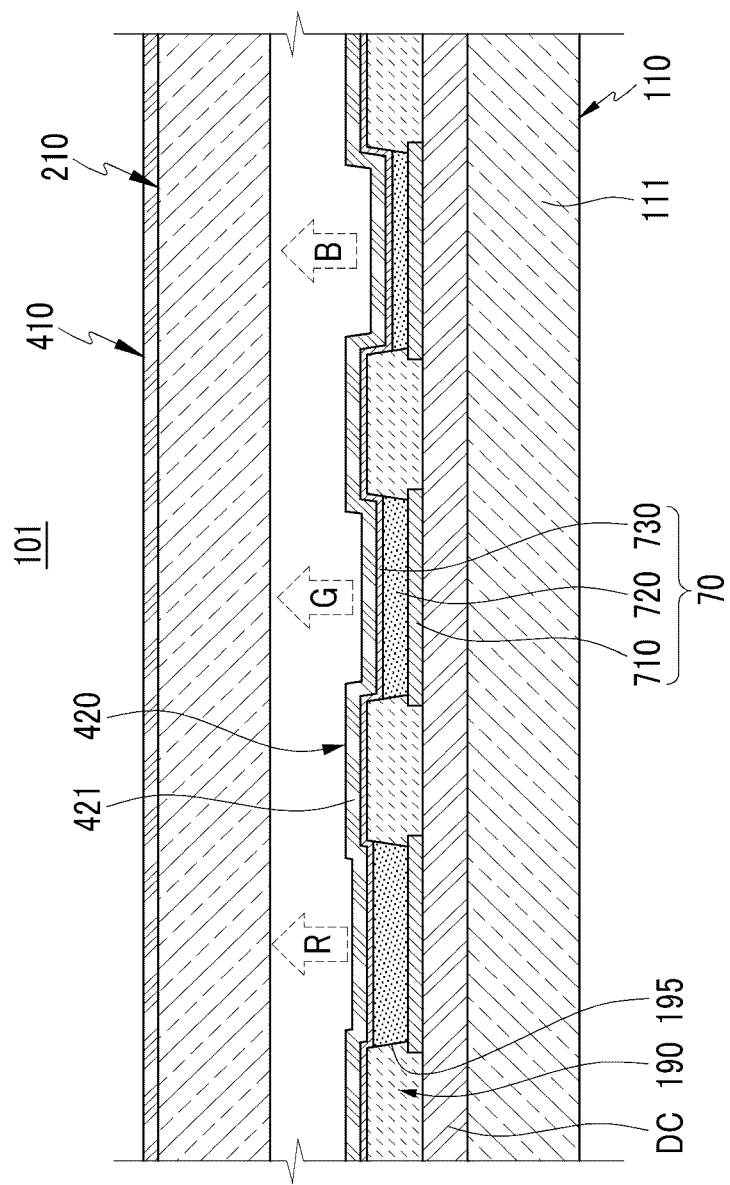
FIG. 1 is a partial cross-sectional view of an embodiment of an organic light emitting diode (OLED) display.

Exemplary embodiments of the present invention will be described more fully hereinafter with reference to the accompanying drawings. As those skilled in the art would realize, the described embodiments may be modified in various ways, without departing from the spirit or scope of the present invention.

Like reference numerals generally designate like elements throughout the specification.

In addition, the size and thickness of each component shown in the drawings are arbitrarily shown for understanding and ease of description, and embodiments of the present invention are not limited thereto.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

An embodiment of an organic light emitting diode (OLED) display will be described with reference to FIG. 1 to FIG. 3.

As shown in FIG. 1, an embodiment of an OLED display 101 includes a substrate main body 111, a driving circuit DC, an organic light emitting element 70, a phase delay capping layer 420, an encapsulation member 210, and a polarizing plate 410. As shown in FIG. 1, the substrate main body 111, and the driving circuit DC and the organic light emitting element 70 formed on the substrate main body 111, are collectively referred to as display substrate 110.

In some embodiments, the substrate main body 111 may be formed with a transparent insulating substrate made of glass, quartz, and ceramic, or may be formed with a transparent flexible substrate made of plastic. In other embodiments, the substrate main body 111 may be formed with a metallic substrate made of stainless steel.

The driving circuit DC is formed on the substrate main body 111. The driving circuit DC includes thin film transistors 10 and 20 (see FIG. 2) and a capacitor 80 (see FIG. 2), and drives the organic light emitting element 70. The organic light emitting element 70 emits light according to a driving signal transmitted from the driving circuit DC, and displays an image.

Figure 2:
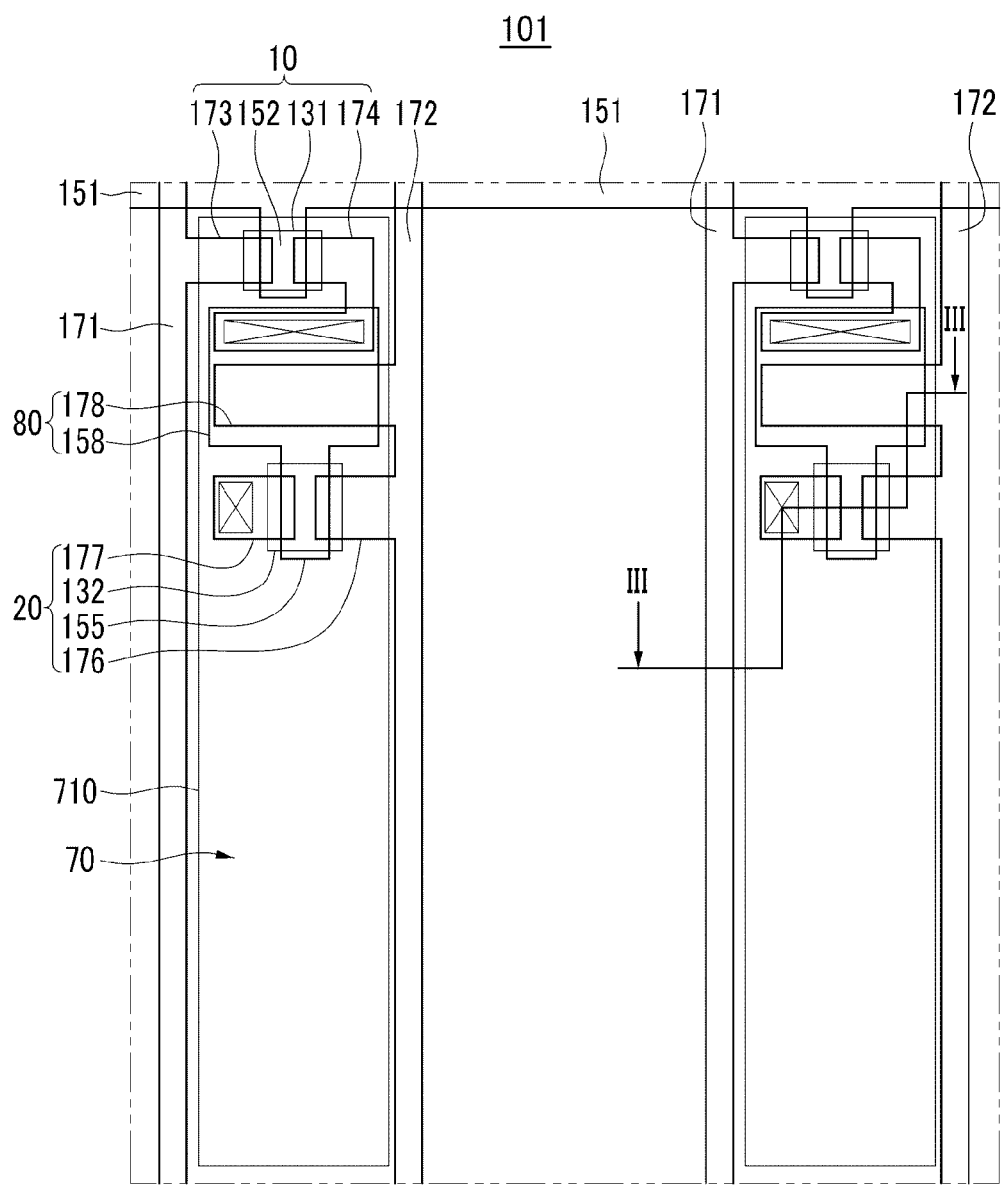
FIG. 2 is a layout view of an embodiment of a pixel circuit of the embodiment of an OLED display of FIG. 1.
Figure 3:
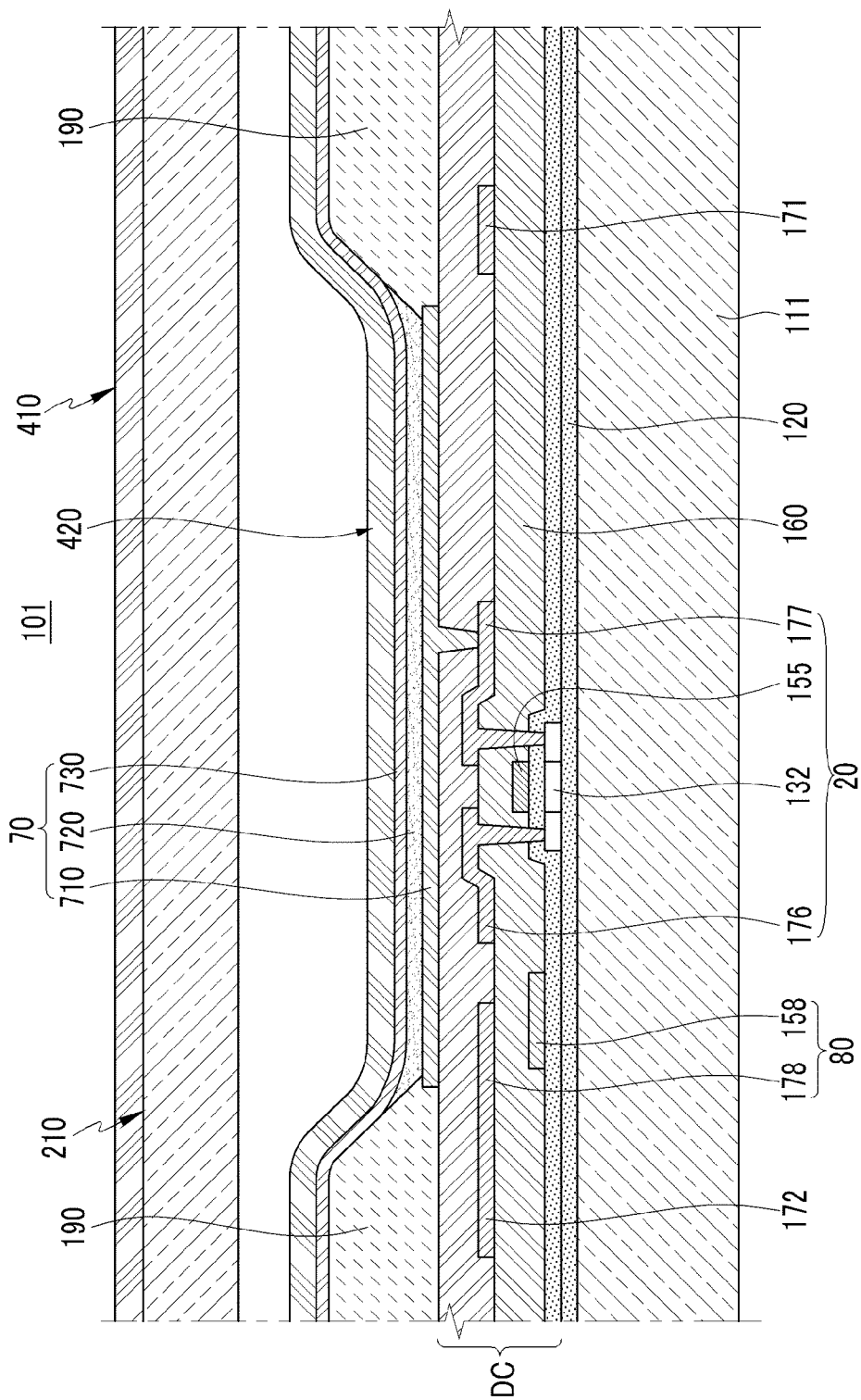
FIG. 3 is a cross-sectional view of FIG. 2, taken along line of FIG. 2.

One embodiment of the structure of the driving circuit DC is shown in FIG. 2 and FIG. 3, but other embodiments of the structure are also possible, as would be apparent to a person skilled in the art.

The organic light emitting element 70 includes a first electrode 710, an organic emission layer 720, and a second electrode 730. In one embodiment, the first electrode 710 may be an anode, which is a hole injection electrode, and the second electrode 730 may be a cathode, which is an electron injection electrode. In other embodiments, the first electrode 710 may be the cathode and the second electrode 730 may be the anode.

In embodiments where the first electrode 710 is a hole injection electrode, the first electrode 710 includes a material having a relatively high work function such as silver (Ag), nickel (Ni), molybdenum (Mo), gold (Au), platinum (Pt), tungsten (W), Cu (copper), and the like, which have a work function higher than about 4.5 eV. The second electrode 730, an electron injection electrode, includes a material having a relatively low work function, such as lithium (Li), magnesium (Mg), calcium (Ca), zinc (Zn), aluminum (Al), and the like, which have a work function lower than about 4.5 eV.

In some embodiments, the first electrode 710 may be formed as a reflective layer and the second electrode 730 may be formed as a semitransparent layer or a transparent conductive layer. Thus, light generated from the organic emission layer 720 is emitted to the outside through the second electrode 730. In the embodiment of FIG. 1, the arrow indicates that the light generated from the organic light emitting element 70 is emitted to the outside after passing through the encapsulation member 210. The embodiment of the OLED display 101 shown in FIG. 1 has a front emission type of structure. In other embodiments, the OLED display 101 may be a dual emission type structure which emits light in both the direction of the substrate main body 111 and the direction of the encapsulation member 210. In such embodiments, the first electrode 710 may be formed with a transparent layer or a transparent conductive layer.

The reflective layer and the semitransparent layer of the electrodes are determined by the thickness of the layer. In general, a semitransparent layer has a thickness in a range of between about 5 nm to about 100 nm, and a reflective layer is relatively thicker than a semitransparent layer. Transmittance of light is increased as the thickness of the semitransparent layer is decreased, and the transmittance is decreased as the thickness is increased. Each metal has a different transmittance of light according to the thickness of the layer. Typically, light transmittance is significantly decreased when the thickness of the semitransparent layer is larger than about 100 nm. An electrical characteristic becomes deteriorated when the thickness of the semitransparent layer is smaller than about 5 nm.

A transparent conductive layer includes at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The first electrode 710 may include a transparent conductive layer. The first electrode 710 may have a multi-layered structure including a reflective layer and a transparent conductive layer. The transparent conductive layer in the first electrode 710 may be disposed between the reflective layer and the organic emission layer 720. The first electrode 710 may have a triple-layered structure with a transparent conductive layer, a reflective layer, and a transparent conductive layer stacked sequentially. Since the transparent conductive layer has a relatively high work function, it helps smoothe hole injection of the first electrode 710. Various metals may be used as the reflective layer of the first electrode 710.

In some embodiments, the organic emission layer 720 may have a multi-layered structure including an emission layer, and at least one of a hole injection layer (HIL), a hole transport layer (HTL), an electron transport layer (ETL), and an electron injection layer (EIL). In some embodiments, only an emission layer may be included. In embodiments with all of the other layers (a hole injection layer (HIL), a hole transport layer (HTL), an electron transport layer (ETL), and an electron injection layer (EIL)), the hole injection layer (HIL) may be the first layer, and the hole transport layer (HTL), the emission layer, the electron transport layer (ETL), and the electron injection layer (EIL) may be sequentially stacked thereon. In other embodiments, the organic emission layer 720 may include other layers.

In embodiments where the first electrode 710 is formed as the reflective layer and the second electrode 730 is formed as the semitransparent layer, the OLED display 101 may improve light use efficiency, or luminance of the light, using a microcavity effect. The microcavity effect can be maximized by controlling a distance between the first and second electrodes 710 and 730 of the organic light emitting element 70. The distance between the first and second electrodes 710 and 730 required for maximizing the microcavity effect is changed according to a color of light emitted from the organic light emitting element 70. The distance between the two electrodes 710 and 730 may be largest in an organic light emitting element 70 that emits red-based light and may be smallest in an organic light emitting element 70 that emits blue-based light.

Luminance efficiency with respect to the power can be effectively improved by arranging cavities (not shown) having different thicknesses according to a color of emitted light in the organic light emitting element 70. The thickest cavity layer may be disposed at the organic light emitting element 70 that emits red-based light, and the thinnest cavity layer may be disposed at the organic light emitting element 70 that emits blue-based light, or the cavity layer may be omitted.

The cavity layer may be separately formed between the first electrode 710 and the second electrode 730, and at least one of the hole injection layer (HIL), the hole transport layer (HTL), the electron transport layer (ETL), and the electron injection layer (EIL) of the organic emission layer 720 may be formed to be thick so as to be used as a cavity layer. In embodiments where the first electrode 710 of the organic light emitting element 70 has the transparent conductive layer, the transparent conductive layer may be used as a cavity layer by increasing the thickness of the transparent conductive layer.

In the embodiment shown in FIG. 1, the OLED 70 that emits red-based light is relatively thick and the OLED 70 that emits blue-based light is relatively thin.

In addition, the OLED display 101 further includes a pixel defining layer 190 having an opening 195 that at least partially exposes the first electrode 710. The organic emission layer 720 emits light within the opening 195 of the pixel defining layer 190. The opening 195 of the pixel defining layer 190 defines a light emission area where light is substantially emitted.

The phase delay capping layer 420 is formed on the second electrode 730 to cover the organic light emitting element 70. The phase delay capping layer 420 protects the organic light emitting element 70 and delays the phase of light generated from the organic light emitting element 70 passing through it. In some embodiments, the phase delay capping layer 420 may function as a quarter (¼)-wavelength plate to delay the phase of light.

In some embodiments, the phase delay capping layer 420 has a refractive index in a range between about 1.8 to about 2.7. Further, the phase delay capping layer 420 may have a double refraction characteristic.

In some embodiments, the phase delay capping layer 420 has a thickness in a range between about 0.9 µm to about 1.3 µm. Such a thickness helps delay the phase of light passing through the phase delay capping layer 420, helps enhance use efficiency of light emitted from the organic light emitting element 70, and protects the organic light emitting element 70.

In some embodiments, the phase delay capping layer 420 may be formed as an oblique deposition layer. The phase delay capping layer 420 may be formed through a thermal deposition process while being inclined between about 40 degrees and about 50 degrees with respect to a deposition direction. In some embodiments, the angle of inclination with respect to the deposition direction may be set such that the phase delay capping layer 420 performs the same function as a ¼-wavelength plate. The phase delay capping layer 420 has a plurality of cylindrical microelements extended and inclined with respect to the deposition direction. The cylindrical elements change the phase of light passing through the phase delay capping layer 420.

In some embodiments, the phase delay capping layer 420 may be formed with a material including at least one of titanium oxide, zirconium oxide, cerium oxide, lead oxide, tin oxide, tantalum oxide, indium oxide, and zinc oxide, each of which has a relatively high refractive index and is capable of thermal deposition.

The encapsulation member 210 is arranged opposite the substrate main body 111 and covers the organic light emitting element 70 and the driving circuit DC. The substrate main body 111 and the encapsulation member 210 are sealed to each other through a sealant formed along the edge of the encapsulation member 210 (not shown). In some embodiments, the encapsulation member 210 may be formed with a transparent insulating substrate formed of glass, quartz, ceramic, plastic and the like.

In other embodiments, the encapsulation member 210 may have an encapsulation thin film structure in which at least one of transparent insulating organic and inorganic layers is stacked.

The polarizing plate 410 is attached to the encapsulation member 210. In some embodiments, a polarization axis of the polarizing plate 410 may be arranged for light that is linearly polarized through the polarization plate 410 to be circularly polarized while passing through the phase delay capping layer 420. In the embodiment shown in FIG. 1, the polarizing plate 410 is attached on the encapsulation member 210. In other embodiments, the polarizing plate 410 may be attached to a side that faces the phase delay capping layer 420 of the encapsulation member 210. In yet other embodiments, the polarizing plate 410 may be disposed directly above the phase delay capping layer 420.

In the embodiment of FIG. 1, the thickness of the OLED display 101 is minimized and reflection of external light is suppressed.

When passing through the polarizing plate 410, external light that is parallel with the polarization axis of the polarizing plate 410 is passed and light that is not parallel with the polarization axis is absorbed. Through this process, approximately 50% of the external light may be eliminated. External light that is linearly polarized through the polarizing plate 410 is circularly polarized through the phase delay capping layer 420. Left-circular polarization is exemplarily described. The left-circularly polarized external light is reflected to at least one of the first and second electrodes 710 and 730. When the light is reflected, the phase of the left-circularly polarized external light is changed to right-circular polarization. Then, this right-circularly polarized external light is linearly polarized again while passing through the phase delay capping layer 420, and the external light is linearly polarized to a direction crossing the polarization axis of the polarizing plate 410. Therefore, the reflected external light cannot be passed and is thus absorbed. Most of the external light is thus eliminated.

In order to effectively suppress the reflection of external light, the polarization plate 410 and a phase delay plate may be replaced with the phase delay capping layer 420. Therefore, an additional phase delay plate may not need to be attached to the encapsulation member 210 so that the entire thickness of the OLED display 101 is minimized.

The phase delay capping layer 420 may be formed by continuous deposition on the organic emission layer 720 and the second electrode 730, and therefore the manufacturing process may be simplified.

The internal structure of an embodiment of the OLED display 101 will be described in further detail with reference to FIG. 2 and FIG. 3. FIG. 2 is a layout view of a pixel structure, and FIG. 3 is a cross-sectional view of FIG. 2, taken along the line The pixel refers to a minimal image display unit of the OLED display 101 and the OLED display 101 displays the image by means of a plurality of pixels.

The embodiment shown in FIG. 2 and FIG. 3 is an active matrix (AM) type of OLED display 101 with a 2Tr-1Cap structure, where a pixel is provided with two thin film transistors (TFT) 10 and 20 and one capacitor 80. Other embodiments of the organic light emitting diode display may be provided with three or more thin film transistors and two or more storage capacitors in one pixel, and may be configured to have various structures with additional wires.

As shown in FIG. 2 and FIG. 3, an embodiment of the OLED display 101 includes a switching thin film transistor 10, a driving thin film transistor 20, a capacitor 80, and an organic light emitting diode (OLED) 70 formed in each pixel. The structure including the switching thin film transistor 10, the driving thin film transistor 20, and the capacitor 80 is referred to as driving circuit DC. The OLED display 101 further includes gate lines 151 arranged in one direction, data lines 171 crossing the gate lines 151, and common power lines 172. The data lines 171 and the common power lines 172 cross each other in an insulated manner.

In one embodiment, a pixel may be defined as the intersection of the gate line 151, the data line 171, and the common power line 172.

As previously described, an embodiment of the OLED 70 includes a first semitransparent electrode 710, an organic emission layer 720 formed on the semitransparent electrode 710, and a second semitransparent electrode 730 formed on the organic emission layer 720. Holes and electrodes from the first semitransparent electrode 710 and the second semitransparent electrode 730 are injected into the organic emission layer 720. The emission of light from the organic emissive layer 720 is made when the excitons, being the combinations of the injected holes and electrons, drop from the excited state to the ground state.

The capacitor 80 includes a pair of capacitor plates 158 and 178 arranged with an interlayer insulating layer 160 interposed therebetween. The interlayer insulating layer 160 may be a dielectric material. The capacitance of the capacitor 80 is determined by the charges charged at the capacitor 80, and the voltages of the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch to select a pixel to emit light. The switching gate electrode 152 is connected to the gate lines 151. The switching source electrode 173 is connected to the data lines 171. The switching drain electrode 174 is separated from the switching source electrode 173 and is connected to one of the capacitor plates 158 and 178.

The driving thin film transistor 20 applies driving power to the pixel electrode 710 for light emission of the organic emission layer 720 of the OLED 70 in the selected pixel. The driving gate electrode 155 is connected to the capacitor plate 158 that is connected with the switching drain electrode 174. The driving source electrode 176 and the capacitor plate 178 are respectively connected with the common power lines 172.

The driving drain electrode 177 is connected to the pixel electrode 710 of the OLED 70 through a contact hole.

The switching thin film transistor 10 is driven by a gate voltage applied to the gate line 151 to transmit a data voltage applied to the data line 171 to the driving thin film transistor 20. A voltage corresponding to a voltage difference between the common voltage applied to the driving thin film transistor 20 from the common power line 172 and the data voltage transmitted from the switching thin film transistor 10 is stored in the capacitor 80, and a current corresponding to the voltage stored in the capacitor 80 flows to the OLED 70 through the driving thin film transistor 20 such that the OLED 70 emits light.

An embodiment of a manufacturing method of the OLED display 101 will be described with reference to FIG. 4.

The driving circuit DC and the OLED 70 are formed on the substrate main body 111 to form the display substrate 110.

Figure 4:
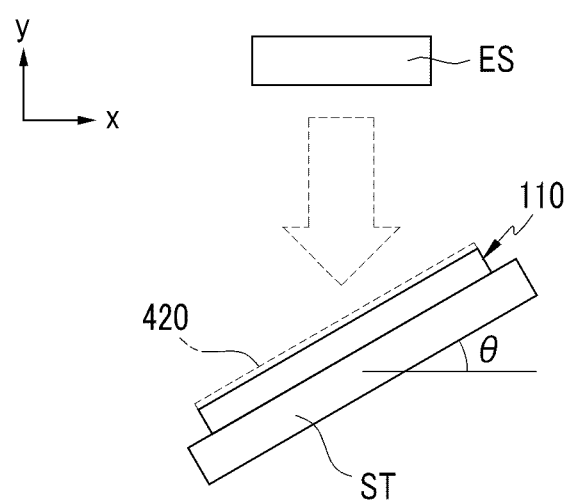
FIG. 4 shows an embodiment of a manufacturing process of the embodiment of an OLED display of FIG. 1.

As shown in FIG. 4, the display substrate 110 is inclined at a predetermined angle θ, and the phase delay capping layer 420 is formed on the OLED 70 through a thermal deposition process. The predetermined angle of inclination θ of the display substrate 110 with respect to the deposition direction (y-axis direction) may be between about 40 degrees and about 50 degrees. In FIG. 4, reference numeral ES denotes a thermal deposition source and reference numeral ST denotes a stage on which the display plate 110 is mounted.

While this disclosure has been described in connection with certain exemplary embodiments, it is to be understood that the invention is not limited to the disclosed embodiments, but, on the contrary, is intended to cover various modifications and equivalent arrangements included within the spirit and scope of the invention.

What is claimed is:

1. An organic light emitting diode (OLED) display comprising:
   a first substrate;
   an organic light emitting diode formed over the first substrate, the organic light emitting diode comprising a reflective surface configured to reflect light incident to the organic light emitting diode;
   a pixel defining layer formed over the first substrate, the pixel defining layer defining a light emitting region and a non-light emitting region of the display;
   a phase delay capping layer formed over the organic light emitting diode, configured to input linearly polarized light and output circularly polarized light, wherein the phase delay capping layer conforms to a shape of the organic light emitting diode and wherein an upper surface of the phase delay capping layer is lower with respect to a light emitting surface in the light emitting region of the display than in the non-light emitting region of the display;
   a second substrate disposed over the phase delay capping layer; and
   a polarizing plate formed over the second substrate, configured to pass through only linearly polarized light.

2. The OLED display of claim 1, wherein the polarizing plate is configured to linearly polarize light beams incident from outside the display to the polarizing plate and selectively pass linearly polarized light beams, which then pass through the second substrate and travel to the phase delay capping layer; wherein the phase delay capping layer is configured to circularly polarize the light beams incident thereto while transmitting the light beams therethrough, whereby the circularly polarized light beams travel to the organic light emitting diode and are at least partially reflected on the reflective surface so as to travel back to the phase delay capping layer, which is configured to further circularly polarize the reflected light beams while transmitting therethrough, whereby the further circularly polarized light beams travel to the polarizing plate, wherein the polarizing plate is configured to substantially not pass the further circularly polarized light beams therethrough to the outside of the display.

3. The OLED display of claim 1, wherein the phase delay capping layer has a thickness in a range between about 0.9 μm and about 1.3 μm.

4. The OLED display of claim 1, wherein the phase delay capping layer has a refractive index in a range between about 1.8 and about 2.7.

5. The OLED display of claim 4, wherein the phase delay capping layer has a double refraction characteristic.

6. The OLED display of claim 1, wherein the phase delay capping layer is a ¼ wavelength plate.

7. The OLED display of claim 4, wherein the phase delay capping layer is formed of a material comprising at least one of titanium oxide, zirconium oxide, cerium oxide, lead oxide, tin oxide, tantalum oxide, indium oxide, and zinc oxide.

8. The OLED display of claim 1, wherein the phase delay capping layer comprises an oblique deposition layer.

9. The OLED display of claim 8, wherein the phase delay capping layer is formed through a thermal deposition process.

10. The OLED display of claim 9, wherein the thermal deposition process is performed with the substrate main body inclined at an angle of between about 40 degrees to about 50 degrees with respect to a deposition direction.

11. The OLED display of claim 10, wherein the phase delay capping layer comprises a plurality of cylindrical microelements that are inclined with respect to the deposition direction and extended in the deposition direction.

12. An organic light emitting diode (OLED) display manufacturing method comprising:
preparing a substrate main body;
forming an organic light emitting diode over the substrate main body;
forming a pixel defining layer over the substrate main body, the pixel defining layer defining a light emitting region and a non-light emitting region of the display; and
forming a phase delay capping layer over the organic light emitting diode through a thermal deposition process with the substrate main body inclined at a predetermined angle, wherein the phase delay capping layer is formed to conform to a shape of the organic light emitting diode and wherein an upper surface of the phase delay capping layer is formed to be lower with respect to a light emitting surface in the light emitting region of the display than in the non-light emitting region of the display.

13. The OLED display manufacturing method of claim 12, wherein the phase delay capping layer has a thickness in a range between about 0.9 μm and about 1.3 μm.

14. The OLED display manufacturing method of claim 12, wherein the method further comprises sealing an encapsulating member and the substrate main body to each other and attaching a polarizing plate to the encapsulating member.

15. The OLED display manufacturing method of claim 12, wherein the predetermined angle is between about 40 degrees to about 50 degrees.

16. The OLED display manufacturing method of claim 15, wherein the phase delay capping layer comprises a plurality of cylindrical microelements that are inclined with respect to the deposition direction and extended in the deposition direction.

17. The OLED display manufacturing method of claim 12, wherein the phase delay capping layer is formed with a material having a refractive index within a range of about 1.8 to about 2.7.

18. The OLED display manufacturing method of claim 17, wherein the phase delay capping layer has a double refraction characteristic.

19. The OLED display manufacturing method of claim 17, wherein the phase delay capping layer is formed of a material including at least one of titanium oxide, zirconium oxide, cerium oxide, lead oxide, tin oxide, tantalum oxide, indium oxide, and zinc oxide.

* * * * *